(12) United States Patent
Furukawa

(10) Patent No.: US 6,723,571 B2
(45) Date of Patent: Apr. 20, 2004

(54) SEMICONDUCTOR DEVICE MANUFACTURING METHOD

(75) Inventor: Yukihiko Furukawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/270,239

(22) Filed: Oct. 15, 2002

(65) Prior Publication Data
US 2003/0077856 A1 Apr. 24, 2003

(30) Foreign Application Priority Data
Oct. 16, 2001 (JP) ........................................ 2001-317667

(51) Int. Cl.[7] .............................................. H01L 21/00
(52) U.S. Cl. ............................................................ 438/9
(58) Field of Search ...................................... 438/9, 714

(56) References Cited
U.S. PATENT DOCUMENTS
4,132,614 A * 1/1979 Cuomo et al. ......... 204/192 EC
6,051,150 A * 4/2000 Miyakawa ................ 216/67

* cited by examiner

Primary Examiner—Hoai Ho
Assistant Examiner—Quoc Hoang
(74) Attorney, Agent, or Firm—Armstrong, Kratz, Quintos, Hanson & Brooks LLP

(57) ABSTRACT

A semiconductor device manufacturing method including a plasma etching process performed on a surface of the semiconductor device is provided. The semiconductor device has a specific metal therein that is unexposed at the surface at the beginning stage of the etching process, the specific metal gets exposed during the etching process, and the existence of the specific metal in an etching reactive chamber affects the rate of etching the semiconductor device. The method is characterized in that the specific metal is plasma etched as pretreatment before starting the plasma etching process of the semiconductor device to keep the etching rate stable.

18 Claims, 5 Drawing Sheets

SEMICONDUCTOR DEVICE MANUFACTURING METHOD

BACKGROUND OF THE INVENTION

1. Field of the Invention

The present invention generally relates to a semiconductor device manufacturing method, and more specifically relates to the semiconductor device manufacturing method having a pretreatment to prevent an etching rate from varying.

2. Description of the Related Art

As semiconductor devices become more integrated, their patterns are required to be more precise. A highly precise and stable dry etching technique is desired for fulfilling such requirements.

Referring to FIGS. 4A and 4B, a conventional etching process will be explained. This conventional etching process shown in FIGS. 4A and 4B is a process for etching an insulator between layers using an ICP etching apparatus.

Referring to FIG. 4A, after the ICP etching apparatus is cleaned, a dummy wafer is used for running.

An etching reactive chamber 41 of the ICP apparatus has a quartz board 42 supporting a planar coil 43, and a quartz window 44 as a monitoring port. Contained inside of the etching reactive chamber 41 is a stage 45 serving as an electrode on which a work piece is mounted. The etching reactive chamber 41 is grounded, and high frequency power for plasma excitation is applied to the planar coil 43 from an exciting RF power supply 47. On the other hand, bias power is applied to the stage 45 from a bias RF power supply 46.

In the running operation, a dummy wafer 48 having a polyimide layer 49 is used. The polyimide layer 49 is the same as the insulator formed on a semiconductor wafer to be etched. A gas is introduced to the etching reactive chamber 41, and is converted to plasma by the exciting RF power to etch the polyimide layer 49.

Referring to FIG. 4B, after the dummy wafer 48 is removed, a semiconductor wafer to be etched is mounted on the stage 45. The polyimide layer 59, the insulator between layers, is selectively etched to open a contact hall 61.

The semiconductor wafer in this conventional example is prepared by the following process:

On a semi-insulating GaAs substrate (not shown), via an i-type AlGaAs buffer layer (not shown), an i-type InGaAs electron transit layer (not shown) is epitaxially grown. On the i-type InGaAs electron transit layer, an n-type AlGaAs electron supplying layer 51 and an n-type GaAs cap layer 52 are sequentially epitaxially grown. Source and drain electrodes 53 each comprising an AuGe layer 54 and an Au layer 55 are formed on the n-type GaAs cap layer 52. After a gate recess region is formed, a T-type gate electrode 56 comprising a Pt layer 57 and an Au layer 58 is formed. Then a polyimide layer 59 as an interlaminar insulator is provided to obtain the desired semiconductor wafer.

In the etching operation, a resist pattern 60 with an opening on the polyimide layer 59 is used as a mask. The opening of the resist pattern 60 desirably corresponds to the contact hall 61 of the polyimide layer 59. $O_2$ gas is introduced to the etching reactive chamber 41, and plasma is generated. The generated plasma selectively etches the polyimide layer 59 to open to the contact halls 61 (one is shown) each reaching one of the source or drain electrodes 53.

Subsequently, a TiW layer as a barrier metal and an Au layer as a plating base layer are formed by sputtering. Then an Au wiring layer is formed by a selective plating technique using a plating frame having a resist pattern, which is not explained in detail.

In this etching apparatus, however, repetition of the process of etching the interlaminar insulator layer causes drastic change in etching rate at the beginning of the etching process and makes the etching process unstable. This problem will be explained below with reference to FIGS. 5A and 5B.

FIG. 5A is an experimental graph showing etching rates depending on the number of repetitions of the etching process as shown in FIG. 4B. It was observed that the etching rate steeply decreases at the beginning of the etching repetition and then becomes stable. In this experiment, the etching was performed for one minute at one time. It is shown in the graph that the etching rate goes down to about a half at the tenth time of etching.

FIG. 5B is a similar graph showing etching rates depending on the number of repetitions of the etching process, in which the Au layers 55 of the source and drain electrodes are not exposed for comparison purposes. It is shown that the etching rate does not change so much.

In comparing FIGS. 5A and 5B, it is believed that the steep change in the etching rate at the beginning of the etching process is due to the exposure of the Au layer 55. More specifically, in the process of opening the contact hall 61, the Au layer 55 is exposed and a portion of the Au flies (becomes airborne) and is scattered in the etching reactive chamber 41, which is believed to be the cause of the etching rate decrease. This etching rate decrease is found also in the case that the exposed metal is Pt, Cu, or Al.

SUMMARY OF THE INVENTION

An object of the present invention is to provide a semiconductor device manufacturing method that substantially prevents the etching rate variation so as to provide excellent reproducible etching results.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the semiconductor device manufacturing method particularly pointed out in the specification in such full, clear, concise, and exact terms as to enable a person having ordinary skill in the art to practice the invention.

In order to attain the object, the semiconductor device manufacturing method of the present invention includes a plasma etching process performed on a surface of the semiconductor device, and the semiconductor device has a specific metal therein that is unexposed at the surface at the beginning stage of the etching process; the specific metal gets exposed during the etching process; the existence of the specific metal in an etching reactive chamber affects the etching rate of the semiconductor device; and the method is characterized in that the specific metal is plasma etched as pretreatment before starting the plasma etching process of the semiconductor device.

In this manner, the specific metal is sputtered in the etching reactive chamber by plasma etching to stabilize the etching rate. In the present specification and claims, the term "plasma etching" includes ion milling performed by making plasma of a gas such as Ar.

According to another feature of the present invention, in the semiconductor device manufacturing method as described above, the pretreatment comprises a step of plasma etching the specific metal disposed on a dummy substrate.

In this manner, the specific metal can be sputtered in the etching reactive chamber by using a dummy substrate during the conventional running operation. Therefore, the etching rate can be stabilized without increasing manufacturing processes of the semiconductor device.

According to another feature of the present invention, a semiconductor device manufacturing method includes a plasma etching process performed on a surface of the semiconductor device, the semiconductor device having a first specific metal therein that is unexposed at the surface at the beginning stage of the etching process; the first specific metal gets exposed during the etching process; the existence of the first specific metal in an etching reactive chamber affects the etching rate of the semiconductor device; and the method comprises a step of introducing a gas containing a second specific metal into the etching reactive chamber as pretreatment before starting the plasma etching process of the semiconductor device.

In this manner, the first specific metal can be sputtered in the etching reactive chamber by using a gas containing a second specific metal without preparing a dummy substrate.

According to another feature of the present invention, in the semiconductor device manufacturing method as described above, plasma is generated after introducing the gas containing the specific metal into the etching reactive chamber.

In this manner, the specific metal can be easily sputtered in the etching reactive chamber by converting the gas containing a second specific metal to plasma.

According to another feature of the present invention, in the semiconductor device manufacturing method as described above, the first specific metal is the same as the second specific metal.

According to another feature of the present invention, in the semiconductor device manufacturing method as described above, the first specific metal is different from the second specific metal.

According to another feature of the present invention, in the semiconductor device manufacturing method as described above, the first specific metal is a metal selected from the group consisting of Au, Pt, Cu, and Al.

So far, at least these metals show a similar effect. The specific metal may include any and all metals showing a similar effect.

According to another feature of the present invention, in the semiconductor device manufacturing method as described above, the pretreatment is performed between a step of cleaning the etching reactive chamber and the plasma etching process.

In this manner, it is advantageous that the pretreatment is performed between the steps of cleaning the etching reactive chamber and the plasma etching process, especially when processing the same lot of semiconductor devices.

According to another feature of the present invention, in the semiconductor device manufacturing method as described above, the pretreatment is performed between a plurality of plasma etching processes.

In the case of successively processing one lot not including exposure of the specific metal and another lot including exposure of the specific metal, it is advantageous that the pretreatment be performed between the one lot not including the specific metal exposure and the other lot including the specific metal exposure.

According to another feature of the present invention, the plasma etching process is a high-density plasma etching process.

According to another feature of the present invention, the high-density plasma etching process is a process selected from the group consisting of an inductively coupled plasma etching process, an electron cyclotron resonance etching process, a magnetron reactive ion etching process and a VHF etching process.

The present invention is effective especially for high-density plasma generated by an inductively coupled plasma (ICP) etching process, an electron cyclotron resonance (ECR) etching process, a magnetron reactive ion etching (MRIE) process and a VHF or UHF etching process.

According to another feature of the present invention, in the semiconductor device manufacturing method as described above, the plasma etching process is performed multiple times.

The plasma etching process can be performed many times since the etching rate is stable for a long time.

DESCRIPTION OF THE PREFERRED EMBODIMENTS

In the following, embodiments of the present invention will be described with reference to the accompanying drawings.

Figure 1:
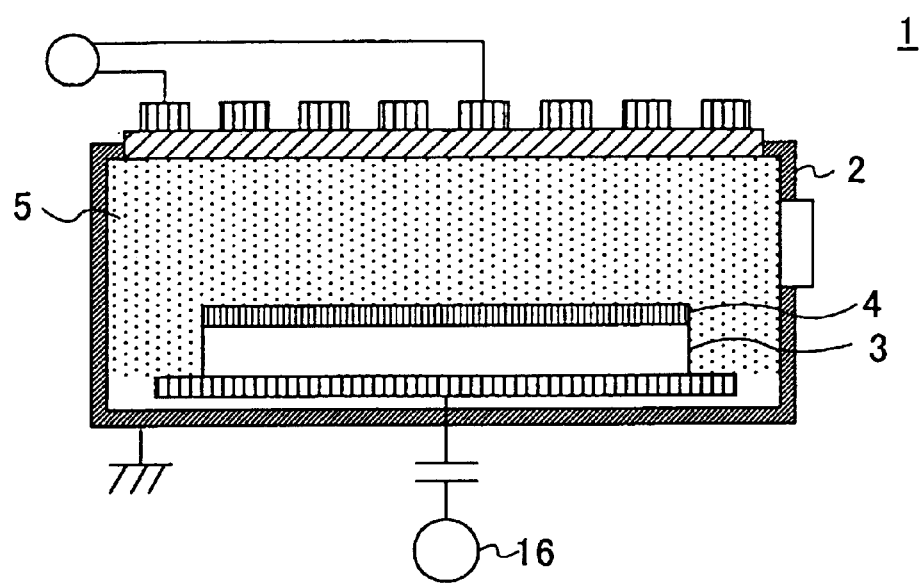
FIG. 1 is a cross-sectional view of an etching apparatus explaining the principle of the present invention.
Figure 2A:
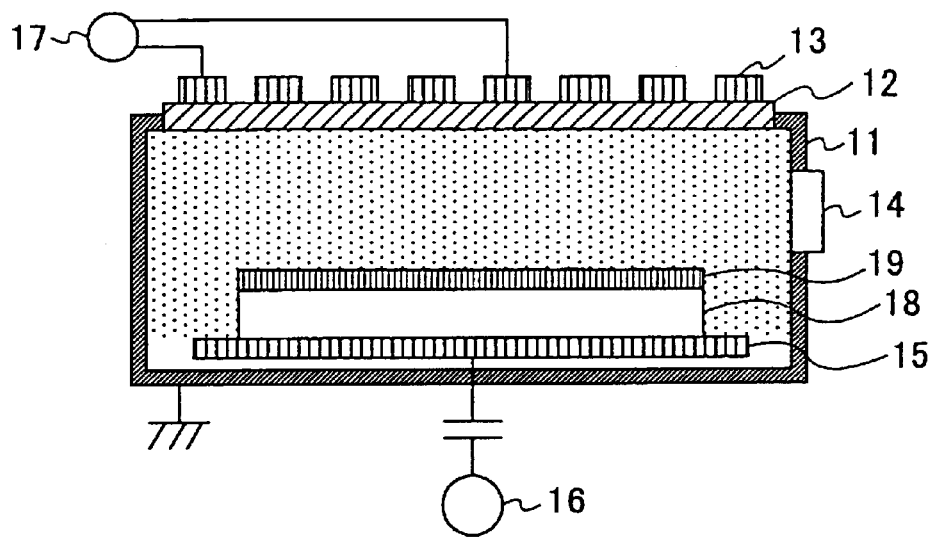
FIG. 2A is a cross-sectional view of an etching apparatus explaining a first embodiment of the present invention.
Figure 2B:
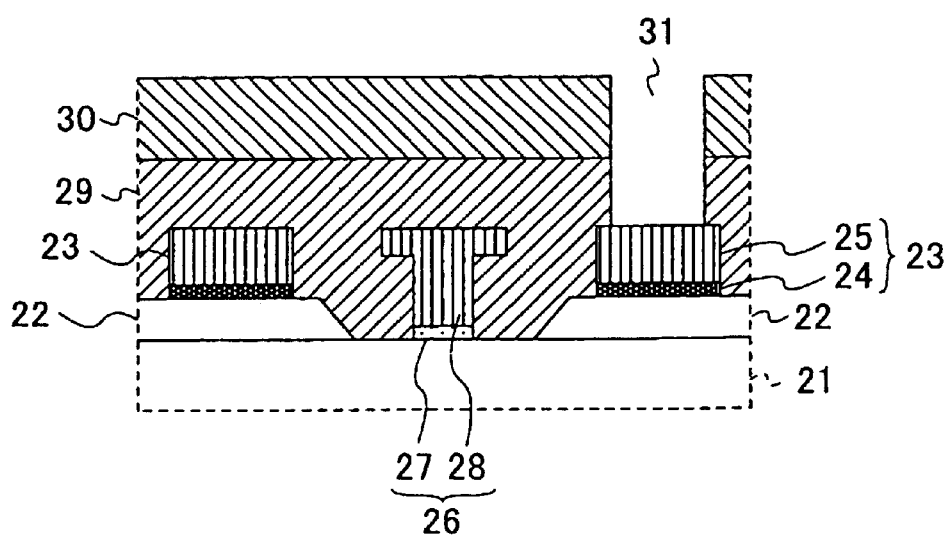
FIG. 2B is a cross-sectional view of a semiconductor device explaining the first embodiment of the present invention.

Referring to FIGS. 2A and 2B, a semiconductor device manufacturing method according to a first embodiment of the present invention will be explained.

Referring to FIG. 2A, after an ICP etching apparatus is cleaned, running is performed using a dummy wafer 18 on which an Au layer 19 has been deposited.

Figure 4A:
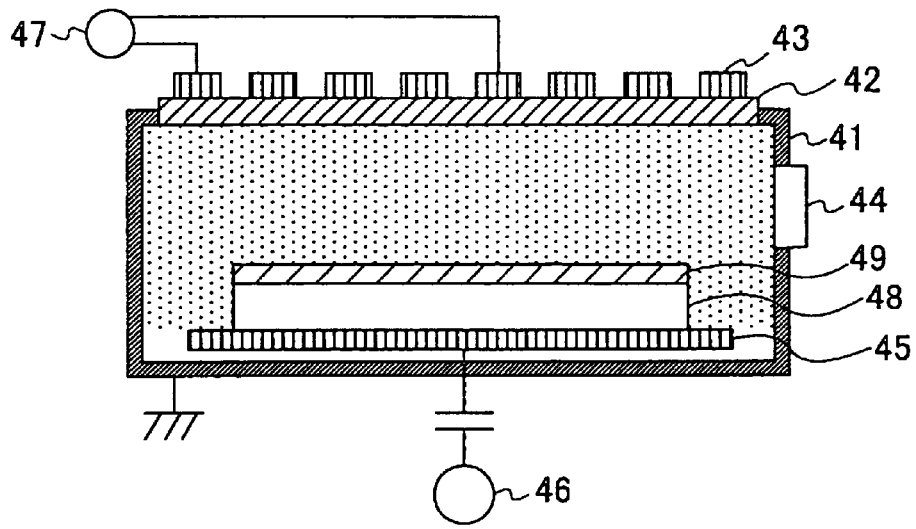
FIG. 4A is a cross-sectional view of an etching apparatus explaining a conventional semiconductor device manufacturing method.
Figure 4B:
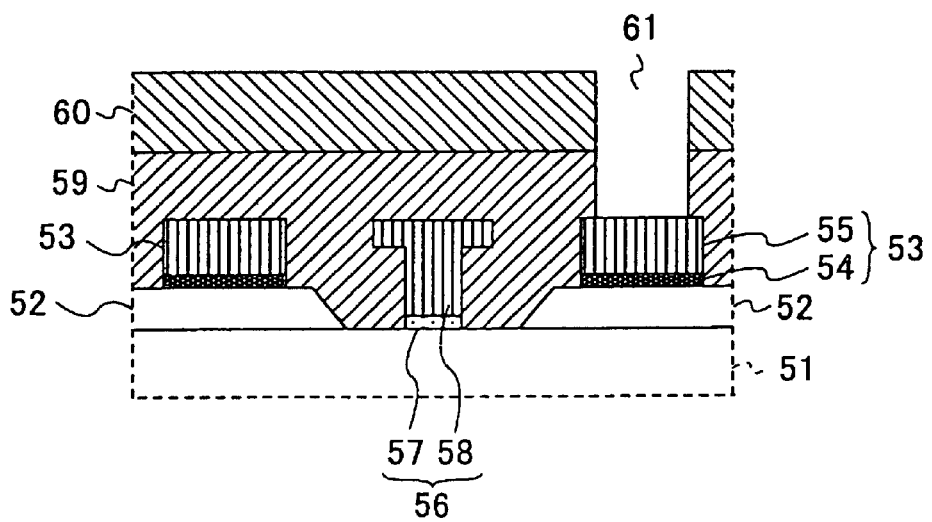
FIG. 4B is a cross-sectional view of a semiconductor device explaining the conventional semiconductor device manufacturing method.
Figure 5A:
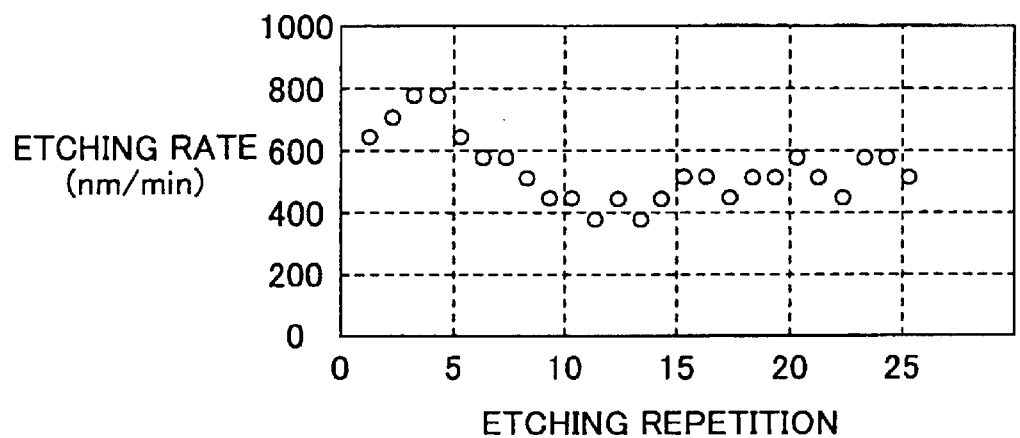
FIGS. 5A and 5B are graphs showing a problem in the conventional semiconductor device manufacturing method.
Figure 5B:
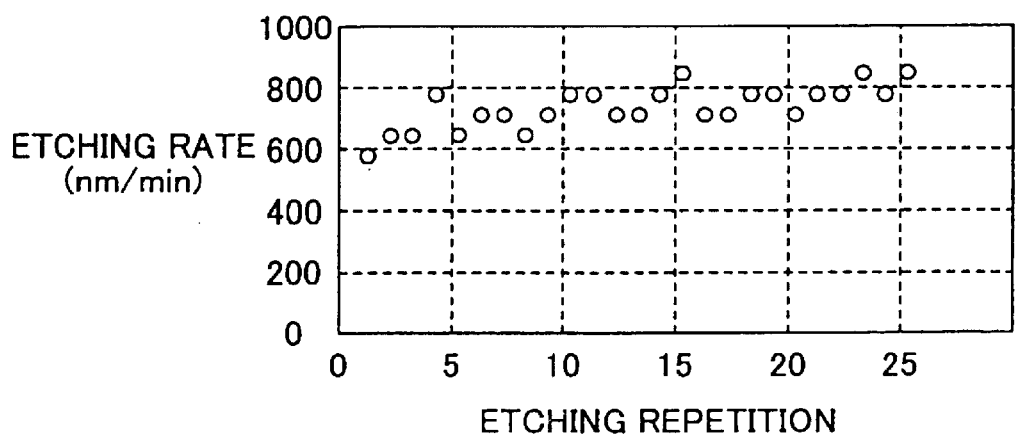

This ICP etching apparatus is similar to the ICP etching apparatus shown in FIG. 4A. An etching reactive chamber 11 of the ICP apparatus has a quartz board 12 supporting a planar coil 13, and a quartz window 14 as a monitoring port. Contained inside of the etching reactive chamber 11 is a stage 15 as an electrode on which a work piece is mounted. The etching reactive chamber 11 has a capacity of about 50 liters, and the stage 15 has an area of 80 square cm.

The etching reactive chamber 11 is grounded, and high frequency power for plasma excitation is applied to the planar coil 13 from an exciting RF power supply 17. On the other hand, bias power is applied to the stage 15 from a bias RF power supply 16.

In this running operation, for example, high frequency power of 13.56 MHz and 400W is applied from the exciting RF power supply 17, and bias power of 13.56 MHz and 50W is applied from the bias RF power supply 16. $O_2$ gas is introduced to the etching reactive chamber 11, and plasma is generated under a pressure of 2.0 Pa to plasma etch 10 wafers for sixty seconds per wafer.

Referring to FIG. 2B, after the dummy wafer 18 is removed, a semiconductor wafer to be etched is mounted on the stage 15. Then, $O_2$ gas is introduced in the etching reactive chamber 11 to generate plasma. Using a resist pattern 30 as a mask having an opening corresponding to contact halls 31 (one is shown), the polyimide layer 29 is selectively etched by the generated plasma to open the contact halls 31 each reaching a source or drain electrode 23.

The semiconductor wafer in this embodiment is prepared by the following process:

On a semi-insulating GaAs substrate (not shown), via an i-type AlGaAs buffer layer (not shown) having a thickness of 200 nm, an i-type InGaAs electron transit layer (not shown) having a thickness of 25 nm is epitaxially grown. On the i-type InGaAs electron transit layer, an n-type AlGaAs electron supplying layer 21 having a thickness of 25 nm and an impurity concentration of $2\times10^{18}$ $cm^{-3}$ and an n-type GaAs cap layer 22 having a thickness of 50 nm and an impurity concentration of $2\times10^{18}$ $cm^{-3}$ are sequentially epitaxially grown. Source and drain electrodes 23 each comprising an AuGe layer 24 having a thickness of 30 nm and an Au layer 25 having a thickness of 300 nm are formed on the n-type GaAs cap layer 22. After a gate recess region is formed, a T-type gate electrode 26 comprising a Pt layer 27 having a thickness of 10 nm and an Au layer 28 having a thickness of 400 nm is formed. Then a polyimide layer 29 as an interlaminar insulator is provided to obtain the desired semiconductor wafer.

Subsequently, a TiW layer as a barrier metal and an Au layer as a plating base layer are formed by sputtering. Then an Au wiring layer is formed by a selective plating technique using a plating frame having a resist pattern. Then exposed portions of the TiW layer and the plating base layer are removed using the Au wiring layer as a mask to obtain wiring layer patterns that electrically connect to the source and drain electrodes 23.

In the first embodiment, even when the above contact hall forming processes were performed 3000 times, the etching rate does not substantially change to the extent of affecting etching reproducibility.

Figure 3A:
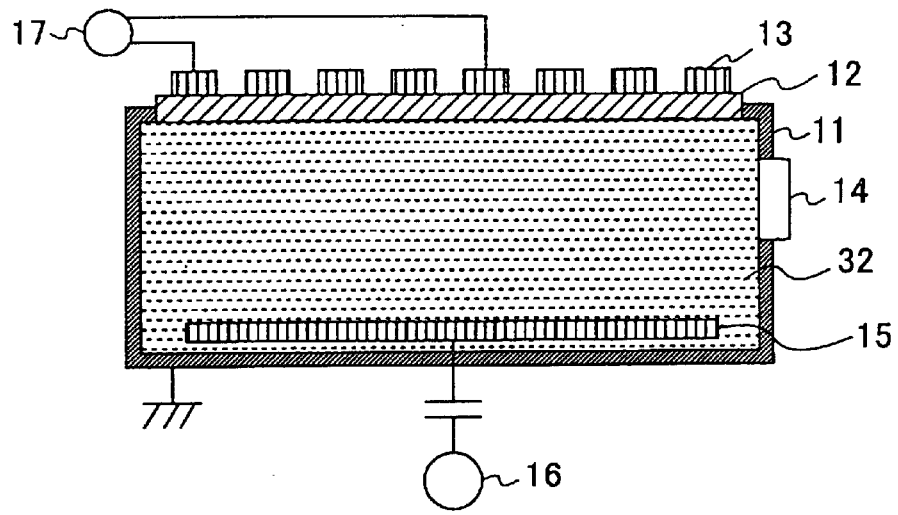
FIG. 3A is a cross-sectional view of an etching apparatus explaining a second embodiment of the present invention.
Figure 3B:
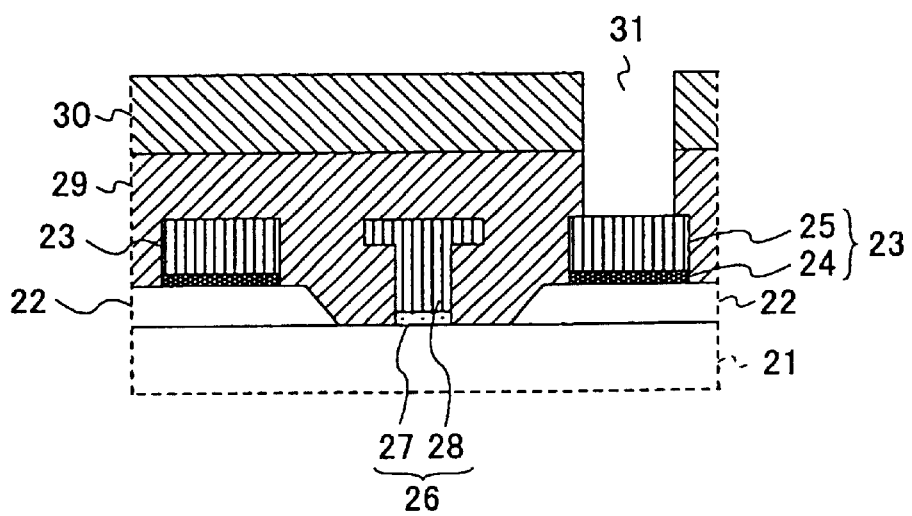
FIG. 3B is a cross-sectional view of a semiconductor device explaining the second embodiment of the present invention.

Referring to FIGS. 3A and 3B, a semiconductor device manufacturing method according to a second embodiment of the present invention will be explained.

Referring to FIG. 3A, a cleaning gas of $O_2+N_2$ with TMAu (tri-methyl gold) added is introduced to the TCP etching reactive chamber 41.

High frequency power of 13.56 MHz and 400W is applied from the exciting RF power supply 17, and bias power of 13.56 MHz and 50W is applied from the bias RF power supply 16. Then plasma is generated under a pressure of 2.0 Pa and 10 minutes of electric discharging.

Referring to FIG. 3B, contact halls 31 are formed in the same manner as shown in FIG. 2B using the same wafer and same conditions.

In the second embodiment, even when the above contact hall forming processes were performed 3000 times, the etching rate does not substantially change to the extent of affecting etching reproducibility.

Although the embodiments of the present invention have been explained as above, the present invention is not limited to the above embodiments, but many changes are possible.

In the above embodiments, Au is exposed at the contact halls, and a dummy wafer having an Au layer is used for the pretreatment. However, other metals such as Pt, Cu and Al similarly affect the etching rate. And therefore these metals can be used for the dummy wafer.

The dummy wafer metal is not necessarily the same as the metal exposed at the contact hall. In the case where any metal of Au, Pt, Cu and Al is used for the pretreatment and any of these metals is exposed at the contact hall, the etching rate can be kept stable.

Although the second embodiments employ TMAu, other bubbled organic metals can be introduced to the etching reactive chamber.

Although the above embodiments use the ICP etching process, other etching processes can be used. For example, other high density plasma etching processes such as an electron cyclotron resonance (ECR) etching process, a magnetron reactive ion etching (MRIE) process and a VHF or UHF etching process can be used.

In the above embodiments, the pretreatment is performed between a cleaning step and the etching step, since only wafers in the same lot are etched.

However, in the case where wafers in a plurality of lots are etched, the pretreatment can be performed before each of the plurality of lots.

In the case of successively processing one lot not including Au, Pt, Cu or Al exposure and another lot including Au, Pt, Cu or Al exposure, the pretreatment can be performed between the one lot not including Au, Pt, Cu or Al exposure and the other lot including Au, Pt, Cu or Al exposure.

In the above embodiments, a polyimide layer is etched. However, the etched layer is not necessarily a polyimide layer but may include any other layer that would change in the etching rate thereof. An etching gas can be changed depending on the etched layer.

The etching process of the present invention is not limited to the contact hall formation process, but includes any etching process during which Au, Pt, Cu or Al is exposed.

In the above embodiments, a III-V type composition semiconductor having HEMT (high electron mobility transistors) devices is used. But the present invention can be applied to III-V type composition semiconductors having other types of devices and silicon semiconductors having MOSFETs.

Further, the present invention is not limited to these embodiments, but various variations and modifications may be made without departing from the scope of the present invention.

The present application is based on Japanese priority application No. 2001-317667 filed on Oct. 16, 2001 with the Japanese Patent Office, the entire contents of which are hereby incorporated by reference.

What is claimed is:

1. A semiconductor device manufacturing method including a plasma etching process performed on a surface of a semiconductor device in an etching reactive chamber, the semiconductor device having a specific metal therein that is unexposed at the surface of the semiconductor device at a beginning stage of the plasma etching process;

the specific metal being exposed during the etching process; and the existence of the specific metal in the etching reactive chamber affecting an etching rate of the semiconductor device;

said semiconductor device manufacturing method being characterized in that a sample of the specific metal, separate from the specific metal within the semiconductor device, is plasma etched in the etching reactive chamber as a pretreatment before starting said plasma etching process on the surface of the semiconductor device.

2. The semiconductor device manufacturing method as claimed in claim 1, wherein the pretreatment is performed between a step of cleaning the etching reactive chamber and the plasma etching process.

3. The semiconductor device manufacturing method as claimed in claim 1, wherein the pretreatment is performed between a plurality of the plasma etching processes.

4. The semiconductor device manufacturing method as claimed in claim 1, wherein the plasma etching process is a high density plasma etching process.

5. The semiconductor device manufacturing method as claimed in claim 4, wherein the high density plasma etching process is a process selected from a group consisting of an inductively coupled plasma etching process, an electron cyclotron resonance etching process, a magnetron reactive ion etching process and a VHF etching process.

6. The semiconductor device manufacturing method as claimed in claim 1, wherein the plasma etching process is performed multiple times.

7. The A semiconductor device manufacturing method including a plasma etching process performed on a surface of a semiconductor device in an etching reactive chamber, the semiconductor device having a specific metal therein that is unexposed at the surface of the semiconductor device at a beginning stage of the plasma etching process;

the specific metal being exposed during the etching process; and the existence of the specific metal in the etching reactive chamber affecting an etching rate of the semiconductor device;

said semiconductor device manufacturing method being characterized in that a sample of the specific metal, separate from the specific metal within the semiconductor device, is plasma etched in the etching reactive chamber as a pretreatment before starting said plasma etching process on the surface of the semiconductor device, wherein the pretreatment comprises a step of plasma etching the specific metal disposed on a dummy substrate.

8. A semiconductor device manufacturing method including a plasma etching process performed on a surface of a semiconductor device, the semiconductor device having a first specific metal therein that is unexposed at the surface at a beginning stage of the plasma etching process;

the first specific metal being exposed during the plasma etching process; and the existence of the first specific metal in an etching reactive chamber affecting an etching rate of the semiconductor device;

said method comprising a step of introducing a gas containing a second specific metal into the etching reactive chamber as a pretreatment before starting said plasma etching process.

9. The semiconductor device manufacturing method as claimed in claim 8, wherein plasma is generated after introducing the gas containing the second specific metal into the etching reactive chamber.

10. The semiconductor device manufacturing method as claimed in claim 8, wherein the first specific metal is the same as the second specific metal.

11. The semiconductor device manufacturing method as claimed in claim 10, wherein the first specific metal is a metal selected from the group consisting of Au, Pt, Cu, and Al.

12. The semiconductor device manufacturing method as claimed in claim 8, wherein the first specific metal is different from the second specific metal.

13. The semiconductor device manufacturing method as claimed in claim 12, wherein the first specific metal is a metal selected from the group consisting of Au, Pt, Cu, and Al.

14. The semiconductor device manufacturing method as claimed in claim 8, wherein the pretreatment is performed between a step of cleaning the etching reactive chamber and the plasma etching process.

15. The semiconductor device manufacturing method as claimed in claim 8, wherein the pretreatment is performed between a plurality of the plasma etching processes.

16. The semiconductor device manufacturing method as claimed in claim 8, wherein the plasma etching process is a high density plasma etching process.

17. The semiconductor device manufacturing method as claimed in claim 16, wherein the high density plasma etching process is a process selected from a group consisting of an inductively coupled plasma etching process, an electron cyclotron resonance etching process, a magnetron reactive ion etching process and a VHF etching process.

18. The semiconductor device manufacturing method as claimed in claim 8, wherein the plasma etching process is performed multiple times.

* * * * *